United States Patent [19]

Curreri et al.

[11] Patent Number: 5,063,518
[45] Date of Patent: Nov. 5, 1991

[54] ALARM SYSTEM FOR A CRYSTAL GROWING FURNACE

[75] Inventors: Victor Curreri, Steauket; John Klein, Port Washington; Janine Dubois, Shirley, all of N.Y.

[73] Assignee: Grumman Aerospace Corporation, Bethpage, N.Y.

[21] Appl. No.: 437,420

[22] Filed: Nov. 16, 1989

[51] Int. Cl.[5] .......................... G06F 15/46; H05B 1/02
[52] U.S. Cl. .................................. 364/503; 219/494; 340/588; 364/557; 374/137
[58] Field of Search ........... 340/511, 588, 589, 825.16; 364/557, 503, 550, 505, 551.01, 500, 477, 554; 374/137; 219/390, 494

[56] References Cited

U.S. PATENT DOCUMENTS

| | | | |
|---|---|---|---|
| 4,543,567 | 9/1985 | Shirata et al. | 340/511 |
| 4,598,271 | 7/1986 | Wägli et al. | 340/511 |
| 4,630,220 | 12/1986 | Peckinpaugh | 364/483 |
| 4,655,041 | 4/1987 | Del Vecchio et al. | 340/588 |
| 4,663,725 | 5/1987 | Truckenbrod et al. | 364/505 |
| 4,727,359 | 2/1988 | Yuch et al. | 340/511 |
| 4,730,101 | 3/1988 | Mahon et al. | 340/589 |
| 4,750,142 | 6/1988 | Akiba et al. | 364/550 |
| 4,884,222 | 11/1989 | Nagashima et al. | 340/589 |
| 4,907,177 | 3/1990 | Curreri et al. | 364/557 |
| 4,923,117 | 5/1990 | Adams et al. | 364/557 |
| 4,952,780 | 8/1990 | Curreri et al. | 219/494 |
| 4,962,299 | 10/1990 | Duborper et al. | 219/494 |

Primary Examiner—Kevin J. Teska
Attorney, Agent, or Firm—Pollock, VandeSande & Priddy

[57] ABSTRACT

The present invention monitors thermocouple data from a semiconductor furnace. The data is checked against a first set of profiles which mimic an intended operational temperature profile for the furnace. If the temperature measured in any zone of the furnace falls outside a first set of maximum and minimum limits fixed by the mimicking profiles, a warning is generated thereby giving operational personnel an opportunity to correct the condition. If the condition remains unchecked and further deviation occurs, a second condition is reached as defined by a corresponding second set of mimicking maximum and minimum profiles. This condition is established as a serious condition which will cause a microprocessor to terminate power supply to the furnace. Otherwise, the quality of the grown crystal would be jeopardized; or sufficiently excessive power would be delivered to the furnace so as to cause its damage or destruction.

2 Claims, 3 Drawing Sheets

ALARM SYSTEM FOR A CRYSTAL GROWING FURNACE

FIELD OF THE INVENTION

The present invention relates to a computer-controlled furnace for growing semiconductor crystals, and more particularly to an alarm system for signalling warnings that certain temperature profiles are being exceeded.

BACKGROUND OF THE INVENTION

Furnaces and ovens for heating articles at elevated temperatures are generally not precise, nor quick to respond to temperature changes. Furnace systems generally have a high degree of inertia, wherein the heating elements and temperature monitors respond very slowly to external commands. Heating systems therefore tend to be difficult to control and temperature requirements can rarely be held to exacting tolerances.

In recent years the need to control furnace temperatures to precise and demanding tolerances has become more critical, particularly in the manufacture of semiconductor materials. Such materials generally require prolonged cycles of heating or cooling at precisely held temperatures or temperature gradients in order that homogeneous, low-defect crystals can be achieved.

It is impractical to have human monitoring of such prolonged heating and cooling cycles so that greater dependence is made upon automated furnaces.

As a precaution to a malfunctioning furnace, a temperature detector may be installed to detect a temperature condition in the furnace that exceeds a safe amount, thereby causing the generation of an alarm so that personnel can shut down the furnace; or the detector may cause automatic shut down of the furnace. As will be appreciated such shut down results in a failed effort to complete the cycle and a great deal of time and effort is lost.

BRIEF DESCRIPTION OF THE INVENTION

The present invention is designed to operate with a computerized furnace system for digitally controlling a temperature profile of a heated semiconductor to within precise given limits. Such a furnace is disclosed in U.S. Pat. Nos. 4,907,177 and 4,952,780, both assigned to the present assignee. The furnace disclosed in these patents comprises a computer which calculates a heat cycle for each heating element in the furnace. There are 24 zones defined along a muffle of the furnace in which a semiconductor crystal to be heated traverses. A heating element in each zone receives power in the form of a stream of electrical pulses which are uniformly spaced in accordance with a calculated heating cycle. The system disclosed therein provides means for quickly and accurately monitoring the temperature profile of a heated charge. The present invention is intended to operate with furnaces having computer control, such as that disclosed in the mentioned patents.

Briefly, the alarm system of the present invention establishes minimum and maximum settings for each of the zones of the furnace. If the temperature in any of the zones falls beyond the settings, a warning alarm is generated thereby enabling manual intervention to correct the condition. A second set of minimum and maximum settings is established for each of the zones so that, if the temperature in any of the zones exceeds the second set of minimum or maximum settings, the computer will shut down the system to prevent a pre-established unsafe situation.

Thus, the present invention establishes two extremely useful monitored conditions; namely, a first warning condition that one or more of the furnace zones is falling outside a first set of minimum and maximum temperatures and a second condition wherein the temperature in one or more zones falls outside an even greater minimum or maximum deviation from a programmed zone temperature profile which would indicate an unsafe situation. The latter condition is recognized by a computer to cause shut down of the furnace system.

RELATED APPLICATIONS

The present invention is related to the semiconductor furnace systems disclosed in the following co-pending applications:

U.S. patent application Ser. No. 132,224, filed Dec. 14, 1987;

U.S. patent application Ser. No. 264,341, filed Oct. 31, 1988; and

U.S. patent application Ser. No. 264,387, filed Oct. 31, 1988;

U.S. patent application Ser. No. 472,232, filed Jan. 30, 1990;

U.S. patent application Ser. No. 482,988, filed Feb. 22, 1990;

U.S. patent application Ser. No. 446,356, filed Dec. 5, 1989.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

The alarm system of the present invention is employed with a computerized furnace system which precisely controls the temperature of a heated semiconductor charge. The furnace of the present invention is a gradient-type furnace, shown in a basic form, in U.S. Pat. No. 4,086,424 which issued Apr. 25, 1978. An improved computer-controlled furnace system of the type previously identified as related patent applications accomplishes precise control by feeding power to heating elements of the furnace in a stream of uniformly spaced pulses. The required amount of power is determined from algorithm equations utilizing monitored temperature readings which are continuously updated.

Typically, there are 24 zones in the furnace. This provides unique flexibility and contributes to achieving precise control and dynamic response. In a preferred construction of this type of furnace, some of the zones may be 10 inches long while others are one inch long.

Zone lengths and numbers can be adjusted for different furnace sizes and profiles. The large number of zones allows the temperature profile to be set precisely and held stable during the processing of a semiconductor material. This ability to set a profile and maintain stability is a significant advance in the state of the art in crystal growth processing.

Figure 1:
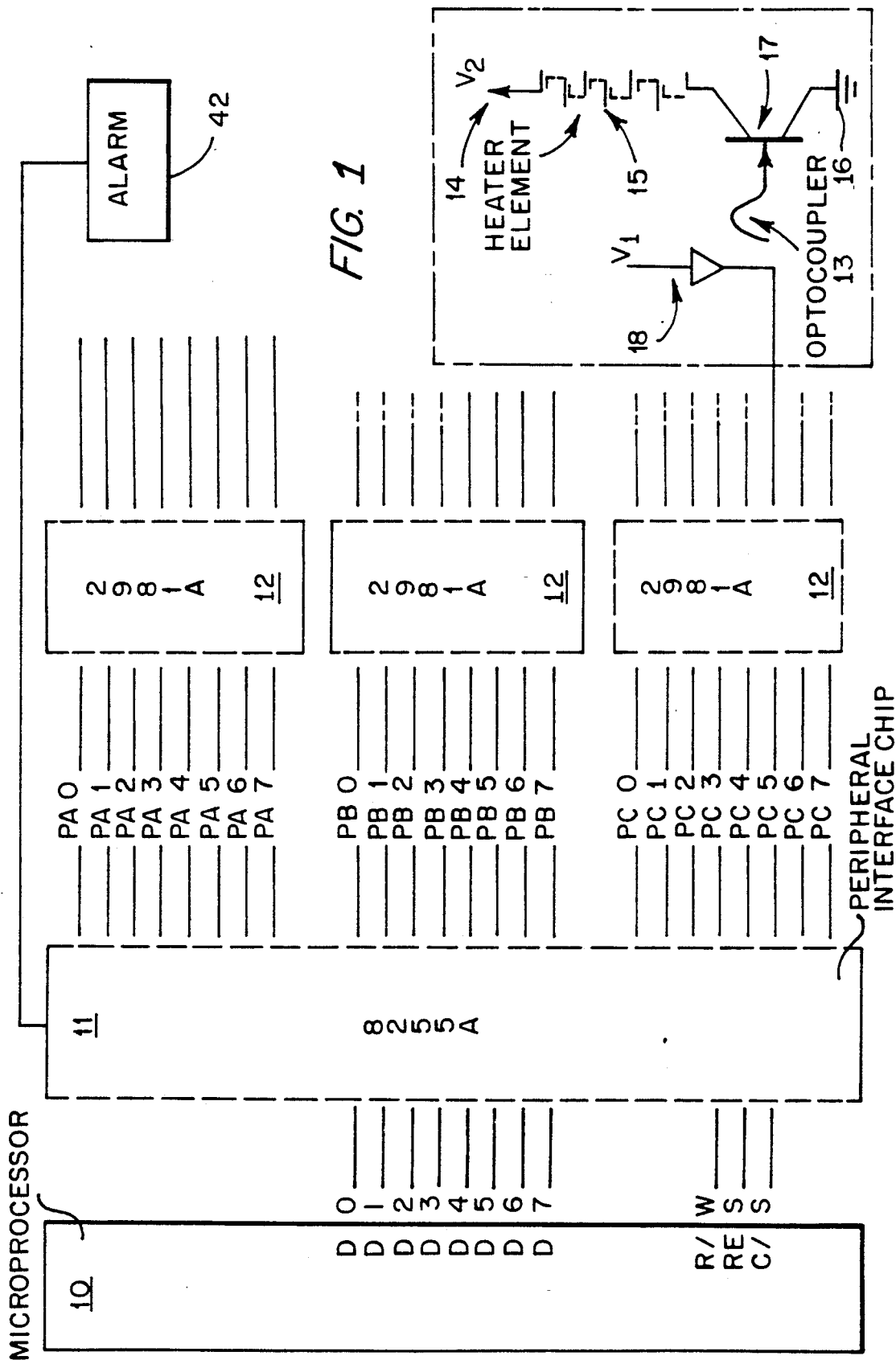
FIG. 1 is a schematic diagram illustrating the inclusion of the present invention in a furnace system.

Referring to FIG. 1 a schematic diagram of the furnace system, to which the present invention is to be added, is shown. Microprocessor 10 generates a plurality of commands through its output (D0-D7) to a peripheral interface chip 11, which combines with three buffer chips 12 to feed 24 heating zones with a stream of digital pulses. Twenty-four optical couplers 13 isolate the power source 14 from the microprocessor 10. Each optical coupler 13 comprises a light-emitting diode 18 and a photosensitive transistor coupled to a power switching transistor 17. Each transistor 17 acts in the capacity of a switch, passing power from power source 14 through each heating element 15 to ground 16, in response to light emitted by its respective LED 18. The optical coupling components provide total electrical isolation between the computer and furnace.

Figure 2:
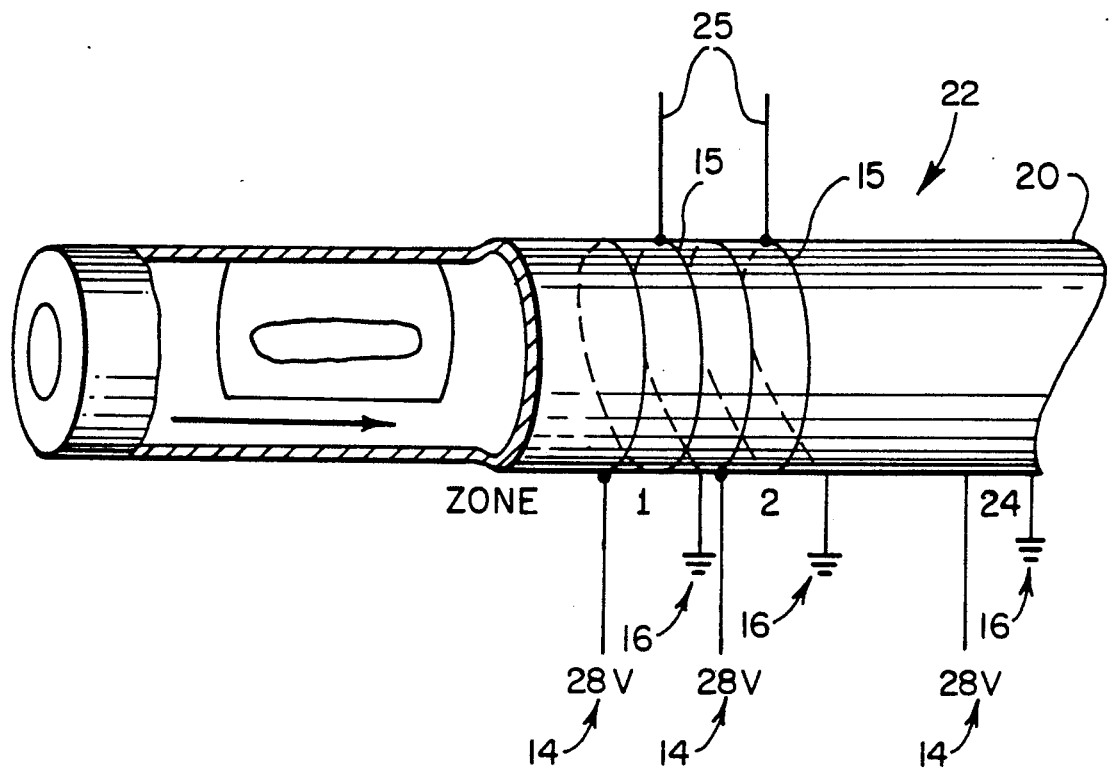
FIG. 2 is a partial cut-away schematic view of a crystal material passing through the muffle of a furnace with which the present invention cooperates.

In addition, the digital switching technique provides efficient power transfer to the heating elements. There is a heating element 15 for each heating zone colinearly spaced next to one another along a muffle 20 of the furnace 22, as illustrated in FIG. 2. A more detailed description of the furnace 22 is provided in the aforementioned U.S. co-pending application Ser. No. 132,224. Each heating element 15 is helically wound directly upon and about the muffle 20. This results in a tight coupling of the power input to the muffle 20. There are several layers of high temperature insulation surrounding the muffle 20. A liquid-cooled outer shell surrounds the furnace insulation.

Figure 3:
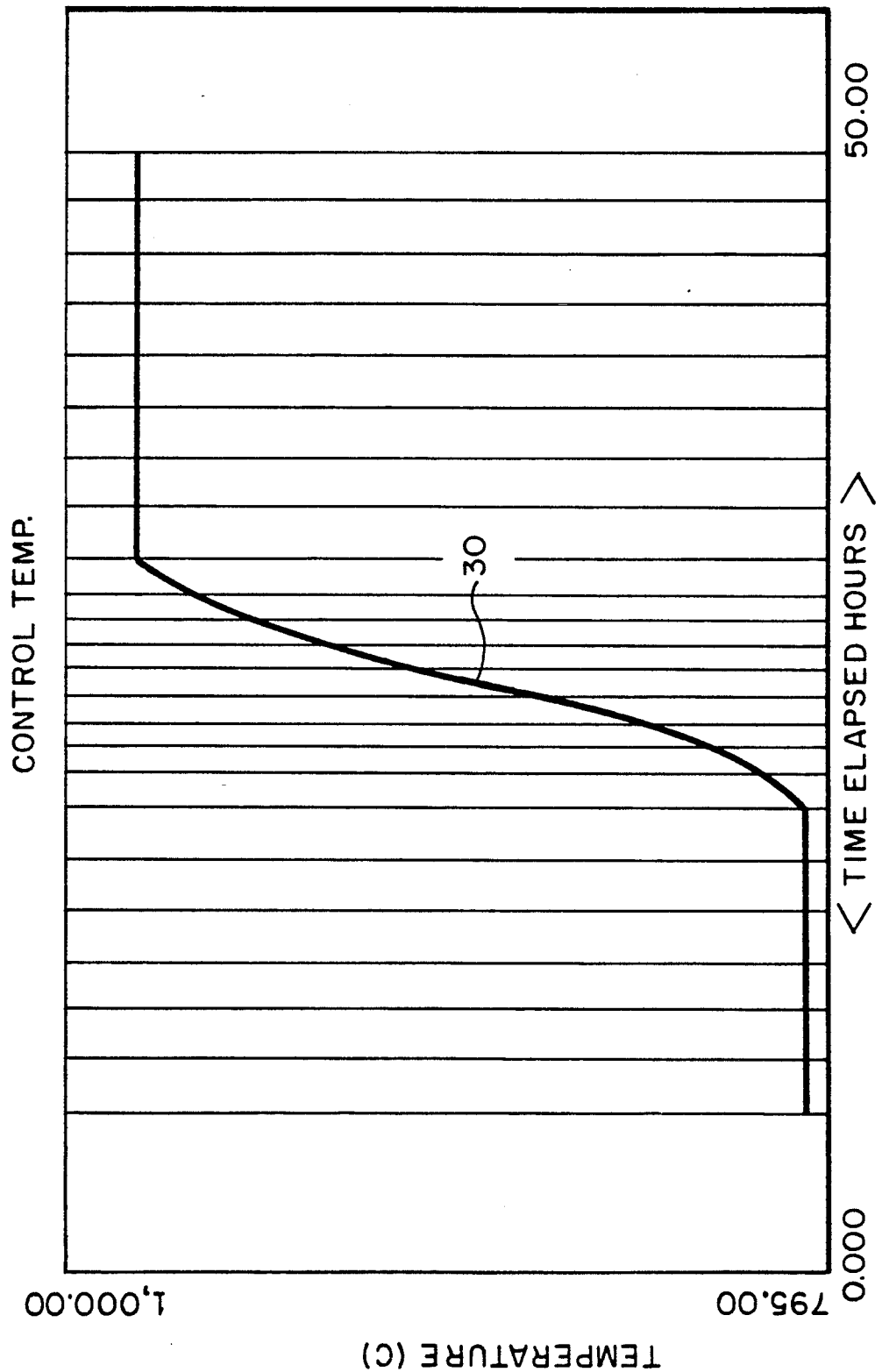
FIG. 3 is a typical temperature profile of the 24 temperature zones of the muffle illustrated in FIG. 2.

A thermocouple 25 is associated with each zone to measure the instantaneous temperature in a respective zone. The readings are fed back to the microprocessor so that the pulse energy supplied to the heating element of each zone is precisely adjusted to follow, in real time, temperature profile 30 as shown in FIG. 3.

All 24 zones are interrogated in a short period of time, for example 2.4 seconds. The thermocouples 25 are each interrogated sequentially by microprocessor 10 on the average of once every 100 milliseconds, and a weighted average can be obtained in accordance with an algorithm equation disclosed in the previously mentioned patents.

All thermocouple outputs are preferably boosted through a calibrated amplifier (not shown), the outputs of which are input to the microprocessor 10 through analog-to-digital converters (not shown). These combined circuits provide extremely accurate measurements.

THE IMPROVEMENT OF THE INVENTION

Figure 4:
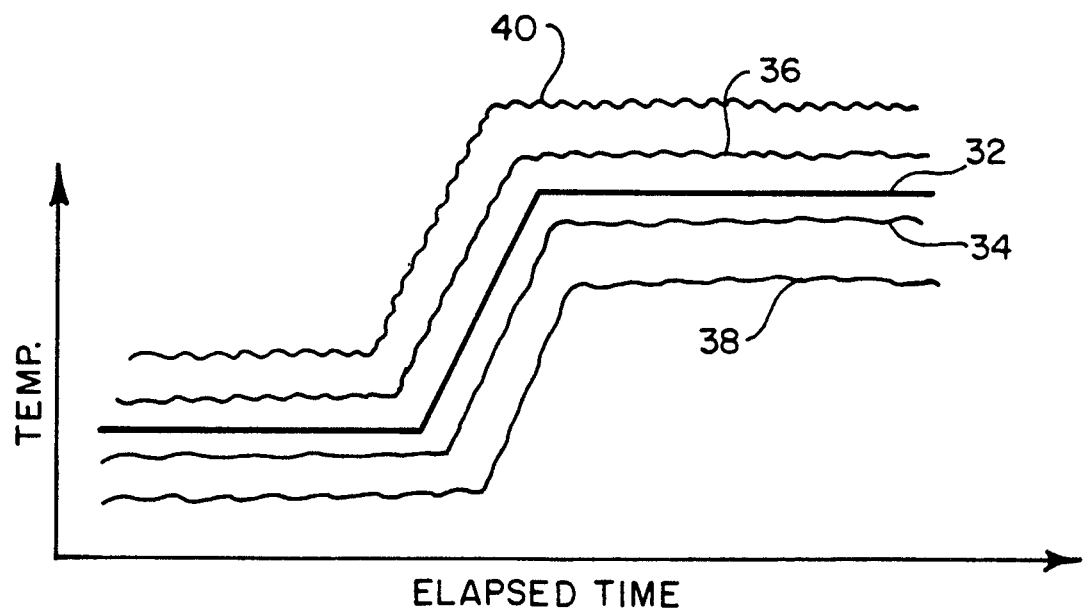
FIG. 4 is a simplified temperature profile, similar to that of FIG. 3, and further showing the two sets of minimum and maximum temperature plots corresponding to warning and shut down furnace conditions.

FIG. 4 graphically illustrates the purpose of the present invention. Reference numeral 32 indicates a typical temperature profile, similar to that indicated by reference numeral 30 in FIG. 3. A warning condition is established by maximum and minimum profiles 36 and 34, respectively. These latter-mentioned profiles mimic the actual operational profile 32. Thus, if an actual operating temperature of the furnace exceeds warning profile 36 or falls below warning profile 34, a warning condition is merited.

As microprocessor 10 receives thermocouple information for each of the zones, the thermocouple data is compared with the profiles 36 and 34 to determine whether the data falls outside the range established by these maximum and minimum profiles so as to warrant a warning condition. If such be the case, the microprocessor may generate a signal indicating that the comparison merits a warning condition and a signal is passed through the peripheral interface chip 11 to an audio or visual alarm at 42. Of course, a CRT monitor used in conjunction with the microprocessor 10 can indicate precisely which zone or zones has been affected.

Returning to FIG. 4 a second set of profiles, namely maximum profile 40 and minimum profile 38, establish sufficient deviation from the intended profile 32 to warrant a shut down condition. These latter-mentioned profiles also mimic the intended operational profile 32 but with larger positive and negative deviations relative to intended profile 32.

In the event that one or more thermocouples indicates that the temperature in corresponding zones exceeds profile 40 or falls below profile 38, an automatic shut down condition is established by the microprocessor which terminates power transmission to the furnace. This event is also manifest by an audio or visual alarm at 42. A CRT monitor can also display specific information by zone.

The actual computer software implementation of the inventive concept is well within the ability of one having ordinary skill in the art since it basically constitutes the relatively straight mimicking of an intended profile 32 with four conditional profiles 34, 36, 38, and 40. The software also achieves comparator operations between thermocouple data and limits on the conditional profiles in a generally straightforward and well-known manner.

Thus, with the present alarm the present invention offers an improvement of semiconductor furnaces by generating a first alarm indicating a warning, during which time an operator can take correctional measures to assure that a semiconductor undergoing growth is again subjected to an intended temperature profile in the furnace. However, if the condition remains uncorrected, the deviation becomes larger and larger until a shut down condition is reached, which will automatically interrupt power delivered to the furnace. As a minor modification the microprocessor may allow a short interval, for example 10 seconds, before it interrupts power to the furnace, after the detection of a shut down condition. This gives operational personnel a last chance to correct the condition before it permanently affects the quality of the crystal being grown or presents the potential for furnace destruction due to excessive power supply.

Thus, the present invention provides an additional quality control capability for ensuring the growth of a homogeneous and uniform semiconductor crystal in a furnace.

It should be understood that the invention is not limited to the exact details of construction shown and described herein for obvious modifications will occur to persons skilled in the art.

We claim:

1. A method for monitoring adjacent temperature zones of a furnace exhibiting a spacial normal temperature profile, the method comprising the steps:

storing the normal temperature profile in memory;

storing a first pair of additional temperature profiles in memory, these profiles mimicking the normal profile and establishing permissible operational positive and negative temperature tolerances relative to the normal temperature profile;

storing a second pair of temperature profiles in memory, these profiles mimicking the normal profile and overlying the first profile pair for establishing positive and negative temperature limits respectively greater in value than the corresponding profiles of the first pair;

sequentially measuring the temperature in each of the zones;

comparing each measured zone temperature with the first pair of profiles, a measured value outside this pair establishing at least a warning condition;

generating a signal for announcing the warning condition;

comparing each measured zone temperature with the second pair of profiles, a measured value outside this pair establishing a shut down condition; and shutting down the furnace upon occurrence of a shut down condition.

2. The method set forth in claim 1 together with the step of signaling the occurence of a shut down condition; and simultaneously introducing a pause before furnace shut down to enable a last moment correction.

* * * * *